United States Patent
Shreeram et al.

(10) Patent No.: US 11,011,523 B2
(45) Date of Patent: May 18, 2021

(54) COLUMN FORMATION USING SACRIFICIAL MATERIAL

(71) Applicant: Micron Technology, Inc., Boise, ID (US)

(72) Inventors: Devesh Dadhich Shreeram, Boise, ID (US); Diem Thy N. Tran, Garden City, ID (US); Sanjeev Sapra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/258,933

(22) Filed: Jan. 28, 2019

(65) Prior Publication Data

US 2020/0243536 A1     Jul. 30, 2020

(51) Int. Cl.
    *H01L 27/108*     (2006.01)
    *H01L 27/105*     (2006.01)

(52) U.S. Cl.
    CPC .... *H01L 27/10861* (2013.01); *H01L 27/1052* (2013.01); *H01L 27/10811* (2013.01); *H01L 27/10829* (2013.01)

(58) Field of Classification Search
    CPC ......... H01L 27/10861; H01L 27/10829; H01L 27/1052
    See application file for complete search history.

(56) References Cited

U.S. PATENT DOCUMENTS

| | | | | |
|---|---|---|---|---|
| 5,597,756 A | * | 1/1997 | Fazan | H01L 27/10817 438/398 |
| 5,677,222 A | * | 10/1997 | Tseng | H01L 27/10817 257/E21.016 |
| 5,770,499 A | * | 6/1998 | Kwok | H01L 27/10817 257/E21.008 |
| 5,851,876 A | * | 12/1998 | Jenq | H01L 27/10817 438/253 |
| 5,998,260 A | * | 12/1999 | Lin | H01L 27/10852 257/E21.648 |
| 6,077,742 A | * | 6/2000 | Chen | H01L 27/10852 257/309 |
| 6,114,201 A | * | 9/2000 | Wu | H01L 28/87 257/E21.009 |
| 6,344,392 B1 | * | 2/2002 | Liaw | H01L 28/87 257/E21.016 |
| 6,376,303 B1 | * | 4/2002 | Seo | H01L 28/87 257/E21.013 |

(Continued)

*Primary Examiner* — Michele Fan
(74) *Attorney, Agent, or Firm* — Brooks, Cameron & Huebsch, PLLC

(57) ABSTRACT

Methods, apparatuses, and systems related to forming a capacitor column using a sacrificial material are described. An example method includes patterning a surface of a semiconductor substrate having: a first silicate material over the substrate, a first nitride material over the first silicate material, a sacrificial material over the first nitride material, a second silicate material over the sacrificial material, and a second nitride material over the second silicate material. The method further includes forming a column of capacitor material in an opening through the first silicate material, the first nitride material, the sacrificial material, the second silicate material, and the second nitride material. The method further includes removing the sacrificial material.

24 Claims, 9 Drawing Sheets

(56) References Cited

U.S. PATENT DOCUMENTS

| | | | |
|---|---|---|---|
| 6,432,795 B1* | 8/2002 | Lee | H01L 28/84 257/E21.013 |
| 6,440,858 B1* | 8/2002 | Canale | H01L 21/3065 257/E21.218 |
| 7,662,693 B2 | 2/2010 | Bhattacharyya | |
| 7,875,529 B2 | 1/2011 | Forbes et al. | |
| 7,875,733 B2 | 1/2011 | Forbes et al. | |
| 8,274,777 B2 | 9/2012 | Kiehlbauch | |
| 2003/0136996 A1* | 7/2003 | Park | H01L 28/87 257/303 |
| 2005/0116318 A1* | 6/2005 | Park | H01L 28/91 257/532 |
| 2005/0255642 A1* | 11/2005 | Liu | H01L 29/66583 438/183 |
| 2006/0113580 A1* | 6/2006 | Cho | H01L 28/75 257/306 |
| 2006/0134854 A1* | 6/2006 | Park | H01L 27/10852 438/239 |
| 2008/0182378 A1* | 7/2008 | Gruening-von Schwerin | H01L 27/10852 438/386 |
| 2010/0240191 A1* | 9/2010 | Chung | H01L 27/10814 438/386 |
| 2011/0065253 A1* | 3/2011 | Huang | H01L 28/90 438/386 |
| 2012/0112317 A1* | 5/2012 | Kang | H01L 27/10817 257/532 |
| 2013/0029487 A1* | 1/2013 | Sako | H01L 21/76898 438/666 |
| 2015/0056805 A1* | 2/2015 | Park | H01L 21/76802 438/672 |
| 2015/0294971 A1* | 10/2015 | Sapra | H01L 27/10805 257/532 |
| 2015/0348963 A1* | 12/2015 | Hung | H01L 27/10852 257/532 |
| 2016/0020212 A1* | 1/2016 | Kim | H01L 28/90 438/666 |
| 2016/0365352 A1* | 12/2016 | Nishikawa | H01L 27/11582 |
| 2017/0345886 A1* | 11/2017 | Yi | H01L 27/10814 |
| 2018/0026040 A1* | 1/2018 | Hong | H01L 27/11582 438/386 |
| 2018/0113975 A1* | 4/2018 | Sherazi | H01L 21/3088 |
| 2018/0151589 A1* | 5/2018 | Shimizu | H01L 27/11582 |
| 2018/0301457 A1* | 10/2018 | Lee | H01L 28/75 |
| 2019/0035743 A1* | 1/2019 | Chang | H01L 27/10808 |
| 2019/0088491 A1* | 3/2019 | Seo | H01L 21/31138 |
| 2020/0105540 A1* | 4/2020 | Park | H01L 21/31058 |

* cited by examiner

COLUMN FORMATION USING SACRIFICIAL MATERIAL

TECHNICAL FIELD

The present disclosure relates generally to semiconductor devices and methods, and more particularly to formation of a column using a sacrificial material.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 1:
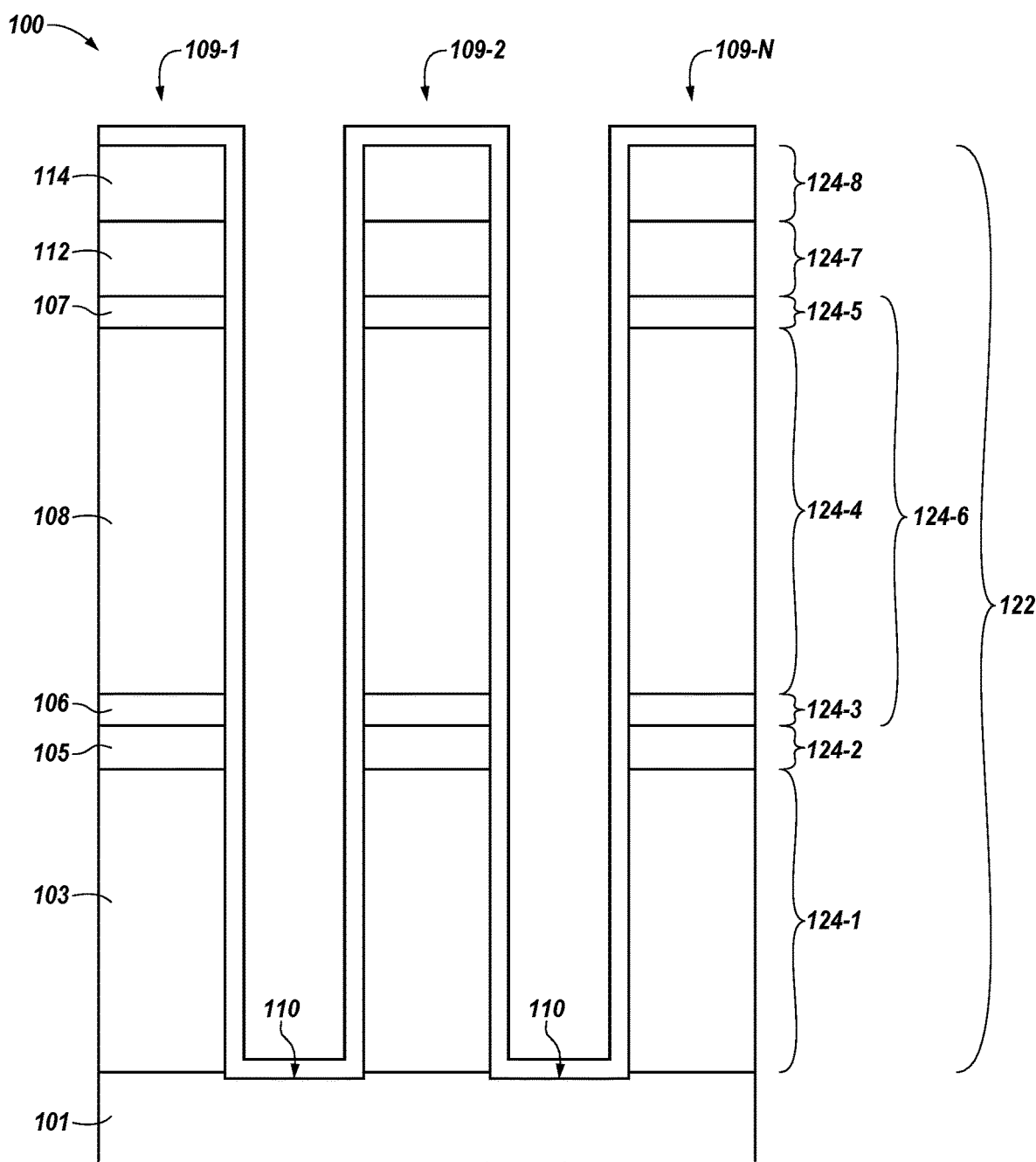
FIGS. 1-7 illustrate cross-sectional views of a portion of a memory device in different examples of the semiconductor fabrication sequence for formation of a plurality of pillars of capacitors using a sacrificial material in accordance with a number of examples of the present disclosure.

Various types of semiconductor structures on memory devices (e.g., those that include volatile or non-volatile memory cells) may include rectilinear trenches and/or round, square, oblong, etc., cavities that may be formed into semiconductor material to create openings thereon for subsequent semiconductor processing steps. Various materials may be deposited using chemical vapor deposition (CVD), plasma deposition, etc. and patterned using photolithographic techniques, doped and etched using vapor, wet and/or dry etch processes to form semiconductor structures on a substrate. Such openings may contain, or be associated with, various materials that contribute to data access, storage, and/or processing, or to various support structures, on the memory device. As an example, capacitor material may be deposited into these openings to provide the data access, storage, and/or processing.

In order to increase the capacitance of a cell of the memory device, a surface area of a semiconductor substrate formed into a column can be increased by increasing the height of the capacitor material column within the opening. However, due to possible gap margins and smaller pitch, increasing the height of a capacitor column can increase the risk of bending and wobbling of the capacitor column, causing possible shorts.

In order to mitigate this issue, a method for forming a capacitor column using a sacrificial material is described further below. As an example, a capacitor can include a mid-lattice portion and top lattice portion including oxides (TEOS and BPSG) in between the mid lattice and top lattice portions. This dual lattice structure can include an amount of recess material (e.g., a sacrificial material of Nitride or Oxide) at the mid lattice. Positioning a sacrificial material within the lattice structure to allow selective tuning of the capacitor profile and to reduce the height of capacitor that is exposed for dry etch.

The present disclosure includes methods, apparatuses, and systems related to forming a capacitor column using sacrificial material. An example of a method described herein includes selectively patterning a pillar on a substrate material. The pillar includes a number of layers of silicate material, a number of layers of nitride material, and sacrificial material within the pillar. The example method further includes forming a capacitor column in an opening through the pillar and removing the sacrificial material.

In the following detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure. As used herein, "a number of" something can refer to one or more such things. For example, a number of capacitors can refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 112 may reference element "12" in FIG. 1, and a similar element may be referenced as 212 in FIG. 2. In some instances, a plurality of similar, but functionally and/or structurally distinguishable, elements or components in the same figure or in different figures may be referenced sequentially with the same element number (e.g., 124-1, 124-2, 124-3, 124-4, 124-5 in FIG. 1).

FIG. 1 illustrates a cross-sectional view 100 of a portion of an example memory device in an example of the semiconductor fabrication sequence for formation of a capacitor in accordance with a number of examples of the present disclosure. The example memory device 100 can include a plurality of pillars 109-1, 109-2, . . . , 109-N (hereinafter referred to collectively as plurality of pillars 109). Each of the plurality of pillars 109 may include a first silicate material 103, shown to have been formed over an underlying substrate material 101. The substrate material 101 may be formed from various undoped or doped materials on which memory device materials may be fabricated. Examples of a relatively inert undoped substrate material 101 may include monocrystalline silicon (monosilicon), polycrystalline silicon (polysilicon), and amorphous silicon, among other possibilities.

In at least one example, the width or diameter of the opening between plurality of pillars 109-1 and 109-2 may be within in a range of from around 200-600 Angstroms (or 20 to 60 nm) and the height of the opening may be within a range of from around 8000-15000 Angstroms (800-1,500 nm) and may result in an aspect ratio (AR) of the height to width being in a range of from around 25:1 to around 50:1 as the etch progresses through the first silicate material 103 and approaches the substrate material 101.

As the height 122 of the plurality of pillars 109-1 to 109-N increases, a bending and/or leaning of the plurality of pillars 109 can occur. In some examples, a support structure may be formed for a second silicate material 108 stacked over the first silicate material 103 adjacent the substrate material 101 in order to minimize this bending and/or leaning. The support structure may, in a number of examples, be formed by patterning (e.g., depositing) a first nitride material 105 and a first sacrificial material 106 between the first silicate material 103 and the second silicate material 108 and forming a second nitride material 112 between a second and a third sacrificial material 102 and 114. The first and second nitride materials 105, 112 may form the support structure by extending between and connecting (e.g., attaching) to features associated with multiple capacitors (e.g., as shown and described in connection with FIGS. 6-7) or other structural elements of the example memory device. A support structure formed as such may enable a stack of the first and the second silicate materials 103, 108 to be maintained in a more static configuration relative to each other and the underlying substrate material 101 than provided by the first and the second silicate materials 103, 108 themselves.

The first silicate material 103 may, in a number of examples, have been formed from a borophosphosilicate glass (BPSG). The BPSG may include a silicon compound doped with various concentrations and/or ratios of a boron compound and a phosphorus compound. The silicon compound may be silicon dioxide ($SiO_2$), which may be formed by oxidation of silane ($SiH_4$), among other possibilities. The boron compound may be diboron trioxide ($B_2O_3$), which may be formed by oxidation of diborane ($B_2H_6$), among other possibilities. The phosphorus compound may be diphosphorus pentoxide ($P_2O_5$), which may be formed by oxidation of phosphine ($PH_3$), among other possibilities. The silicon, boron, and phosphorus compounds of the BPSG may include various isotopes of silicon, boron, and phosphorus, as determined to be appropriate for functionality, formation, and/or removal of the first silicate material 103, as described herein.

The first silicate material 103 may be originally formed (e.g., deposited) over a surface 110 of the underlying substrate material 101. For example, the first silicate material 103 may be formed without an opening formed therein from an upper surface of the first silicate material 103 to the surface 110 of the underlying substrate material 101. The layer of the first silicate material 103 may, in a number of examples, be deposited to a thickness in a range of from around 400 nanometers (nm) to around 600 nm above the surface 210 of the underlying substrate material 201. However, embodiments of the present disclosure are not limited to this example.

A first nitride material 105 is shown to have been formed over a surface of the first silicate material 103 opposite from the underlying substrate material 101. The first nitride material 105 may be formed (e.g., deposited) over an upper surface of the first silicate material 103. Alternatively, the first nitride material 105 may be formed (e.g., deposited) as two separate portions (e.g., layers) over the upper surface of the first silicate material 103. For example, the first silicate material 103 may be formed with an opening (such as the opening illustrated between the plurality of pillars 109-1 and 109-2 in FIG. 1, illustrated as pillars in this 2-dimensional format but not necessarily pillars in a 3-dimensional format, for example) formed therein from an upper surface of the first nitride material 105 to an upper surface of the first silicate material 103.

The first nitride material 105 may be formed from a nitride material selected for dielectric properties. For example, one or more dielectric nitrides may be selected from silicon nitride ($SiN_x$, $Si_3N_4$), aluminum nitride (AlN), gallium nitride (GN), tantalum nitride (TaN, $Ta_2N$), titanium nitride (TiN, $Ti_2N$), and tungsten nitride (WN, $W_2N$, $WN_2$), among other possibilities, for formation of the first nitride material 105. The first nitride material 105 may, in a number of examples, be deposited to a thickness in a range of from around 10 nm to around 100 nm above the surface of the first silicate material 103.

A sacrificial material 106 is shown to have been formed over a surface of the first nitride material 105 opposite from the first silicate material 103. The sacrificial material 106 may be formed (e.g., deposited) over an upper surface of the first nitride material 105.

Similar to the first nitride material 105, the sacrificial material 106 may be formed from a nitride material selected for dielectric properties. In some examples, the sacrificial material 106 may be a second nitride material. In one example, the sacrificial material 106 can be a different nitride material than the first nitride material 105. That is, the sacrificial material 106 may be doped to be a harder nitride material than the first nitride material 105 and the second nitride material 112. Softer nitride is more etch-resistant, as such the hardness of the sacrificial material 106 may provide a more selective tuning of the capacitor column profile. The sacrificial material 106 may be selected from boron nitride (BN), $SiN_x$, $Si_3N_4$, AlN, GN, TaN, $Ta_2N$, TiN, $Ti_2N$, WN, $W_2N$, and $WN_2$, among other possibilities. The sacrificial material 106 may, in a number of examples, be deposited to a thickness in a range of from around 10 nm to around 100 nm above the surface of the first nitride material 105.

A second silicate material 108 is shown to have been formed over a surface of the sacrificial material 106 opposite from the first nitride material 105. The second silicate material 108 may, in a number of examples, be formed from tetraethyl orthosilicate (Si(OC2H5)4), which is also referred to as TEOS. TEOS may be formed as an ethyl ester of orthosilicic acid (Si(OH)4), among other possibilities. The second silicate material 108 may, in a number of examples, be deposited to a thickness in a range of from around 200 nm to around 600 nm above the surface of the second silicate material 106.

A second sacrificial material 107 is shown to have been formed over a surface of the second silicate material 108 opposite from the first sacrificial material 106. The second sacrificial material 107 may be formed (e.g., deposited) over an upper surface of the second silicate material 108.

Similar to the first sacrificial material 106, the second sacrificial material 107 may be formed from a nitride material selected for dielectric properties. In some examples, the second sacrificial material 107 may be the same nitride material as the first sacrificial material 106. In one example, the second sacrificial material 107 may be a different nitride material than the first and second nitride materials 105 and 112. The second sacrificial material 107 may, in a number of examples, be deposited to a thickness in a range of from around 10 nm to around 60 nm above the surface of the second silicate material 108.

A second nitride material 112 is shown to have been formed over a surface of the second sacrificial material 107 opposite from the second silicate 108. The second nitride material 112 may be formed (e.g., deposited) over an upper surface of the second sacrificial material 107.

Similar to the first nitride material 105, the second nitride material 112 may be formed from a nitride material selected for dielectric properties. That is, the second nitride material 112 may be formed from the same material as the first nitride material 105. In various examples, the first nitride material 105 and the second nitride material 112 may be formed from a same nitride or a same mixture of nitrides or the first and second nitride materials 105, 112 each may be formed from one nitride or from a different mixture of nitrides dependent upon, for example, various uses to which the nitrides may be applied. The second nitride material 112 may, in a number of examples, be deposited to a thickness in a range of from around 10 nm to around 150 nm above the surface of the second sacrificial material 107.

A third sacrificial material 114 is shown to have been formed over a surface of the second nitride material 112 opposite from the second sacrificial material 107. The third sacrificial material 114 may be formed (e.g., deposited) over an upper surface of the second nitride material 112. In a number of examples, the third sacrificial material 114 may be deposited to a thickness in a range of from around 50 nm to around 150 nm above the surface of the second nitride material 112.

In some examples, the first, second, and third sacrificial materials 106, 107, and 114, may be formed from the same nitride material. The first, second, and third sacrificial materials 106, 107, and 114, may be formed from a nitride material selected for dielectric properties. In some examples, one of the first, second, and third sacrificial materials 106, 107, and 114, may be formed from a different nitride material than the other sacrificial materials. In one example, the first, second, and third sacrificial materials 106, 107, and 114, may be a different nitride material than the first and second nitride materials 105 and 112. That is, the first, second, and third sacrificial materials 106, 107, and 114, may be doped to be a harder nitride material than the first and second nitride materials 105 and 112.

In some examples, the first and second nitride materials 105 and 112 may be more etch-resistant than the first, second, and third sacrificial materials 106, 107, and 114. The difference in material strength of the first, second, and third sacrificial materials 106, 107, and 114 may provide for the sacrificial material 206 to be etched at a different rate than the first and second nitride materials 105 and 112. That is, composition of the first, second, and third sacrificial materials 106, 107, and 114 may allow selective etching of the plurality of pillars 109.

An etch process (e.g., a first wet etch process or dry etch process) may be utilized to etch into a via (e.g., through) the third sacrificial material 114, the second nitride material 112, the second sacrificial material 107, the second silicate material 108, the first sacrificial material 106, the first nitride material 105, and/or the first silicate material 103 to form an opening 132-1 and 132-2 within the previously listed materials (as is illustrated already between the plurality of pillars 109-1 and 109-2). Performance of the etch process may allow for a formation of a column of capacitor material in an opening 132-1 and 132-2 through various combinations of the plurality of pillars 109-1 in order to form a resultant opening that extends from the upper surface of the third sacrificial material 114 to the surface 110 of the substrate material 101.

The resultant opening may have a height 122 in a range of from approximately 8,000 Angstroms (or 800 nm) to approximately 15,000 Angstroms (or 1,500 nm). Each of the materials may contribute a particular height to the overall height 122 of the structure. As is illustrated in FIG. 1, the first silicate material 103 can have a height 124-1, the first nitride material 105 can have a height 124-2, the first sacrificial material 106 can have a height 124-3, the second silicate material 108 can have a height 124-4, the second sacrificial material 107 can have a height 124-5, the second nitride material 112 can have a height 124-7, and the third sacrificial material 114 can have a height 124-8, that, when added together, results in the overall height 122.

The height 124-6 between the first nitride material 105 and the second nitride material 112 may remain the same whether there is one or a plurality of sacrificial materials. In some examples, the height 124-4 of the second silicate material 108 may be reduced to accommodate for the height 124-5 of the second sacrificial material 107. In this example, the height 124-3 of the first sacrificial material 106, the height 124-4 of the second silicate material 108, and the height 124-5 of the second sacrificial material 107 may add up to a height 124-6. That is, the height 124-6 between the first nitride material 105 and the second nitride material 112 may remain the same once the first sacrificial material 106, the second silicate material 108 and the second sacrificial material 107 have been etched away. The reduction of the height 124-4 of the second silicate material 107 ensures the height 124-6 between the first the first nitride material 105 and the second nitride material 112 may remain the same particular height 124-6.

In some examples, the height 124-1 of the first silicate material 103 can be one of approximately 4000 Angstroms, approximately 4200 Angstroms, approximately 4500 Angstroms, approximately 4900 Angstroms, approximately 5300 Angstroms, approximately 5700 Angstroms, and/or within a range from approximately 4000 to approximately 6000 Angstroms. In some examples, the height 124-2 of the first nitride material 105 can be one of approximately 100 Angstroms, approximately 400 Angstroms, approximately 700 Angstroms, and/or within a range from approximately 100 to approximately 1000 Angstroms. In some examples, the height 124-3 of the first sacrificial material 106 can be one of approximately 100 Angstroms, approximately 300 Angstroms, approximately 550 Angstroms, approximately 870 Angstroms, and/or within a range from approximately 100 to approximately 1000 Angstroms. In some examples, the height 124-4 of the second silicate material 108 can be one of approximately 2000 Angstroms, approximately 3500 Angstroms, approximately 4700 Angstroms, and/or within a range from approximately 2000 to 6000 Angstroms. In some examples, the height 124-5 of the second sacrificial material 107 can be one of approximately 100 Angstroms, approximately 220 Angstroms, approximately 450 Angstroms, approximately 570 Angstroms, and/or within a range from approximately 100 to approximately 600 Angstroms. In some examples, the height 124-7 of the second nitride material 112 can be one of approximately 100 Angstroms, approximately 400 Angstroms, approximately 700 Angstroms, approximately 800 Angstroms, and/or within a range from approximately 100 to approximately 1500 Angstroms. In some examples, the height 124-8 of the third sacrificial material 114 can be one of approximately 500 Angstroms, approximately 750 Angstroms, approximately 970 Angstroms, approximately 1200 Angstroms, and/or within a range from approximately 500 to approximately 1500 Angstroms. However, embodiments of the present disclosure are not limited to this example.

Figure 2:
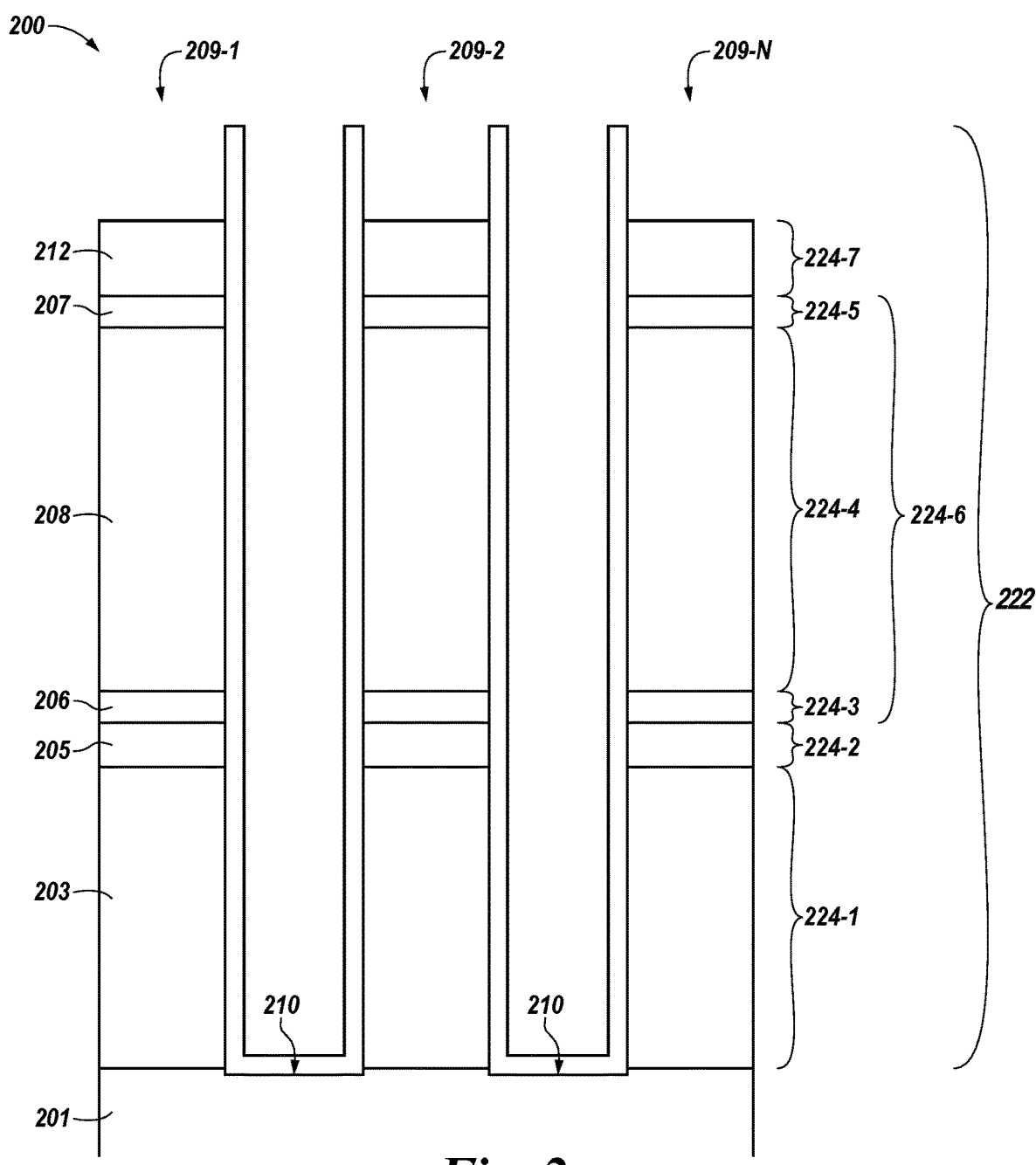

FIG. 2 illustrates a cross-sectional view 200 of a portion of an example memory device in another example of the semiconductor fabrication sequence for formation of a capacitor in accordance with a number of examples of the present disclosure. FIG. 2 illustrates a structure of the portion of the example memory device at the particular stage following completion of the example fabrication sequence described in connection with FIG. 1.

The cross-sectional view 200 can include the same or similar elements as the example cross-sectional view 100 as referenced in FIG. 1. For example, the substrate material 201 is analogous or similar to substrate material 101. First silicate material 203 is analogous or similar to first silicate material 103, first nitride material 205 is analogous or similar to first nitride material 105, first sacrificial material 206 is analogous or similar to sacrificial material 106, second silicate material 208 is analogous or similar to second silicate material 108, second sacrificial material 207 is analogous or similar to second sacrificial material 107, and second nitride material 212 is analogous or similar to second nitride material 112.

In this example, the third sacrificial material (e.g. BN, SiNX, Si3N4, AN, or GN) shown at 114 in FIG. 1 has been removed from the portion of the example memory device. The third sacrificial material may be removed with (via application of) a solvent that is selective for removing (e.g., dissolving) the third sacrificial material from the memory device while not removing (e.g., leaving) other materials such that those materials remain in the memory device. Such a selective solvent may be selected from water ($H_2O$), methanol ($CH_3OH$), ethanol ($C_2H_5OH$), isomers of propanol ($C_3H_7OH$) such as n-propanol and isopropanol, n-butanol ($C_4H_9OH$), among other possible alcohols, and sulfuric acid ($H_2SO_4$), Hydrofluoric acid (HF), Phosphoric Acid ($H_3PO_4$), Hydrochloric Acid (HCl), Ammonium Hydroxide ($NH_4OH$), and combinations thereof, among other possibilities. Removal of the third sacrificial material may leave empty spaces (e.g., voids) in the structure of the memory device during the fabrication process.

An etch process (e.g., a first wet etch process or dry etch process) may be utilized to etch via (e.g., through) the second nitride material 212, the second sacrificial material 207, the second silicate material 208, the first sacrificial material 206, the first nitride material 205, and/or the first silicate material 203 to form an opening within the previously listed materials (as is illustrated already between the plurality of pillars 209-1 and 209-2). Performance of the etch process may result in formation of a column of capacitor material in an opening through various combinations of the capacitor columns 209-1 in order to form a resultant opening that extends from height 222 of the plurality of pillars 209 to the surface 210 of the substrate material 201.

The resultant opening may have a height 222 in a range of from around 8,000 Angstroms (or 800 nm) to around 15,000 Angstroms (or 1,500 nm). Each of the materials can contribute a particular height to the overall height 422 of the structure. As is illustrated in FIG. 2, the first silicate material 203 can have a height 224-1, the first nitride material 205 can have a height 224-2, the first sacrificial layer 206 can have a height 224-3, the second silicate material 208 can have a height 224-4, the second sacrificial material 207 can have a height 224-5, and the second nitride material 212 can have a height 224-7, that, when added together, along with the height of the removed third sacrificial material, results in the overall height 222.

In some examples, the height 224-1 of the first silicate material 203 can be one of approximately 4000 Angstroms, approximately 4200 Angstroms, approximately 4500 Angstroms, approximately 4900 Angstroms, approximately 5300 Angstroms, approximately 5700 Angstroms, and/or within a range from approximately 4000 to approximately 6000 Angstroms. In some examples, the height 224-2 of the first nitride material 205 can be one of approximately 100 Angstroms, approximately 400 Angstroms, approximately 700 Angstroms, and/or within a range from approximately 100 to approximately 1000 Angstroms. In some examples, the height 224-3 of the first sacrificial material 206 can be one of approximately 100 Angstroms, approximately 300 Angstroms, approximately 550 Angstroms, approximately 870 Angstroms, and/or within a range from approximately 100 to approximately 1000 Angstroms. In some examples, the height 224-4 of the second silicate material 208 can be one of approximately 2000 Angstroms, approximately 3500 Angstroms, approximately 4700 Angstroms, and/or within a range from approximately 2000 to 6000 Angstroms. In some examples, the height 224-3 of the second sacrificial material 207 can be one of approximately 100 Angstroms, approximately 220 Angstroms, approximately 450 Angstroms, approximately 570 Angstroms, and/or within a range from approximately 100 to approximately 600 Angstroms. In some examples, the height 224-7 of the second nitride material 212 can be one of approximately 100 Angstroms, approximately 400 Angstroms, approximately 700 Angstroms, approximately 800 Angstroms, and/or within a range from approximately 100 to approximately 1500 Angstroms. However, embodiments of the present disclosure are not limited to this example.

Figure 3:
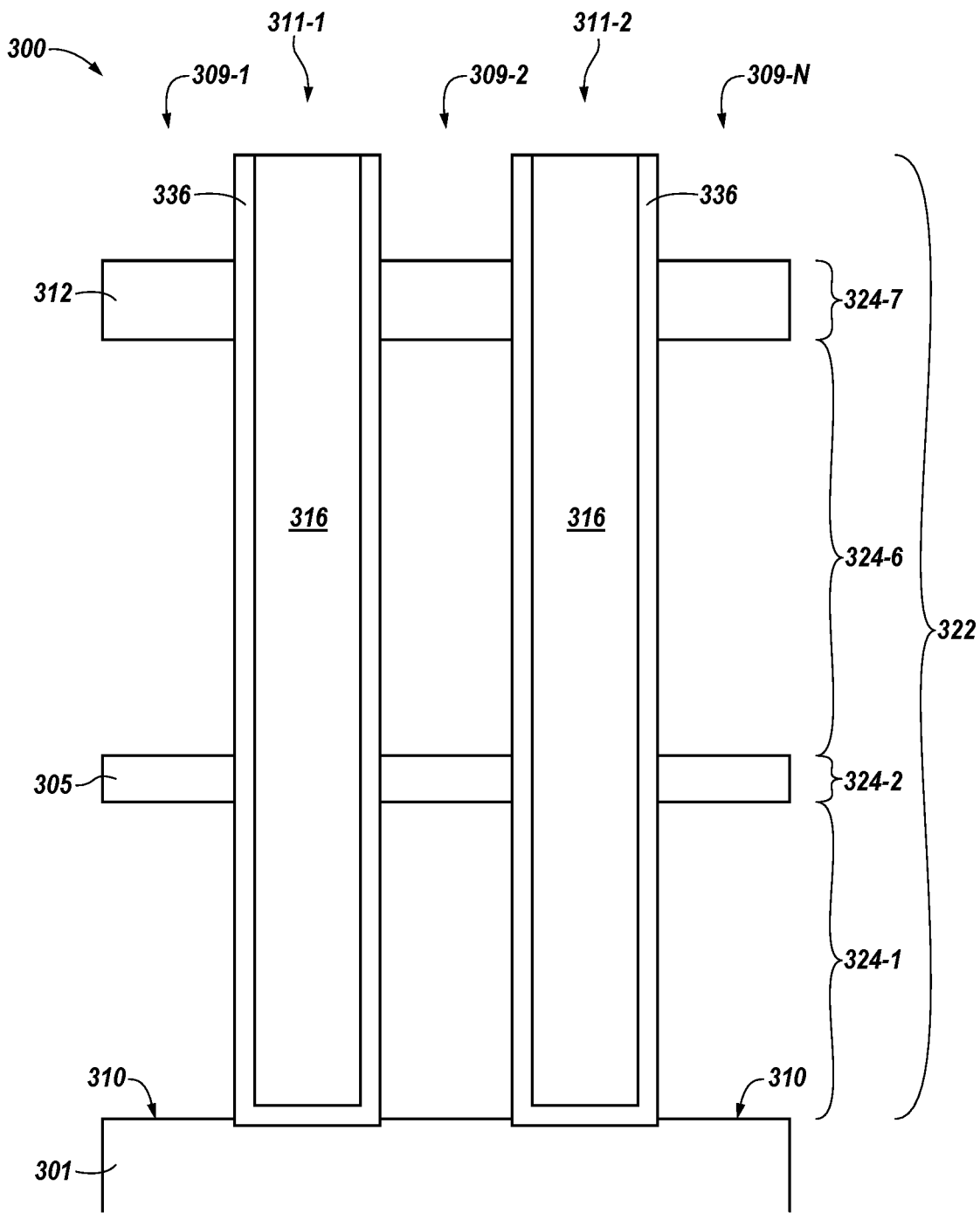

FIG. 3 illustrates a cross-sectional view 300 of a portion of an example memory device in another example of semiconductor fabrication sequence for formation of a capacitor in accordance with a number of examples of the present disclosure. FIG. 3 illustrates a structure of the portion of the example memory device at the particular stage following completion of the example fabrication sequence described in connection with FIG. 2.

The cross-sectional view 300 can include the same or similar elements as the example cross-sectional views 100 and 200 as referenced in FIGS. 1 and 2, respectively. For example, the substrate material 301 is analogous or similar to substrate material 101 and 201 of FIGS. 1 and 2, respectively. The first nitride material 305 is analogous or similar to first nitride material 105 and 205 of FIGS. 1 and 2, respectively. The second nitride material 312 is analogous or similar to second nitride material 112 and 212 of FIGS. 1 and 2, respectively.

In this example, the first silicate material (e.g., BPSG, borosilicate glass (BSG), phosphosilicate glass (PSG), or TEOS) shown at 203 in FIG. 2, the first sacrificial material (e.g. BN, SiNX, Si3N4, AlN, or GN) shown at 206 in FIG. 2, the second silicate material (e.g., BPSG, BSG, PSG, or TEOS) shown at 208 in FIG. 2, and the second sacrificial material (e.g. BN, SiNX, Si3N4, AlN, or GN) shown at 206 in FIG. 2 have been removed from the portion of the example memory device. The first silicate material, the second silicate material, and the first and second sacrificial materials may be removed with (via application of) a solvent that is selective for removing (e.g., dissolving) the first and second silicate materials and the first and second sacrificial material from the memory device while not removing (e.g., leaving) other materials such that those materials remain in the memory device. Such a selective solvent may be selected from water ($H_2O$), methanol ($CH_3OH$), ethanol ($C_2H_5OH$), isomers of propanol ($C_3H_7OH$) such as n-propanol and isopropanol, n-butanol ($C_4H_9OH$), among other possible alcohols, and sulfuric acid ($H_2SO_4$), Hydrofluoric acid (HF), Phosphoric Acid ($H_3PO_4$), Hydrochloric Acid (HCl), Ammonium Hydroxide ($NH_4OH$), and combinations thereof, among other possibilities. Removal of the first silicate material, the first sacrificial material, the second silicate material, and the second sacrificial material may leave empty spaces (e.g., voids) in the structure of the memory device during the fabrication process.

In contrast, the application of the selective solvent may leave the capacitor material 316 having the first electrode material 336 formed on an outer surface thereof remaining in the structure of the memory device. In addition, the first nitride material 305 and the second nitride material 312 may be left remaining following the application of the selective solvent, among other possible components or structural features that may remain in the structure of the memory device. The remaining first nitride material 305 and the remaining second nitride material 312 may function as a capacitor support structure, to provide support in view of the voids in the structure of the memory device during the fabrication process.

As is illustrated in FIG. 3, a height 322 of the capacitor material 316 may include a height 324-2 of the first nitride material 305 and height 324-7 and the second nitride material 312 along with heights 324-6 and 324-1 of the removed second silicate material, the first and second sacrificial materials, and the first silicate material, respectively and the height of the previously removed third sacrificial material 114 as illustrated in FIG. 1.

As shown in FIG. 3, a first electrode material 336 has been formed (e.g., deposited) on the surface 310 of the substrate material 301 and on the sidewalls of the openings 311-1 and 311-2. As is illustrated in FIG. 3, a capacitor material 316 is shown as having been formed (e.g., deposited) to fill the openings 311-1, 311-2 from the substrate material 301 to a height 322 of the opening 311 at the upper surface of the plurality of pillars 309. An opening 311-1 between materials 309-1 and 309-2 may extend from the substrate material 301 to the height 322 of the opening 311 at the upper surface of the plurality of pillars 309. For clarity in the example fabrication sequence, FIG. 3 shows a first opening 311-1 and a second opening 311-1 in the portion of the example memory device, although examples are not limited to two openings and may include various such openings.

In a number of examples, the capacitor material 316 may be deposited to fill the openings 311-1, 311-2 to an upper surface of the first electrode material 336. The first electrode material 336 and the capacitor material 316 may be formed from conductive materials and to various widths (e.g., thicknesses) as suited to a particular design rule for the formation of an operable capacitor for a semiconductor device.

The first electrode 336 may be formed (e.g., deposited) on upper surfaces of remaining portions of the capacitor material 316, such that the capacitor material 316 is covered on all surfaces with the first electrode material 336. That is, a height 322 of the capacitor material 316 is covered by the first electrode material 336. As an example, the height 322 of the capacitor material 316 spans the height 324-1 of the removed first silicate material, the height 324-2 of the first nitride material 305, the height 324-6 of the removed first sacrificial material, second silicate material, and the second sacrificial material, the height 324-7 of the second nitride material 312, and the height of the previously removed third sacrificial material.

Figure 4:
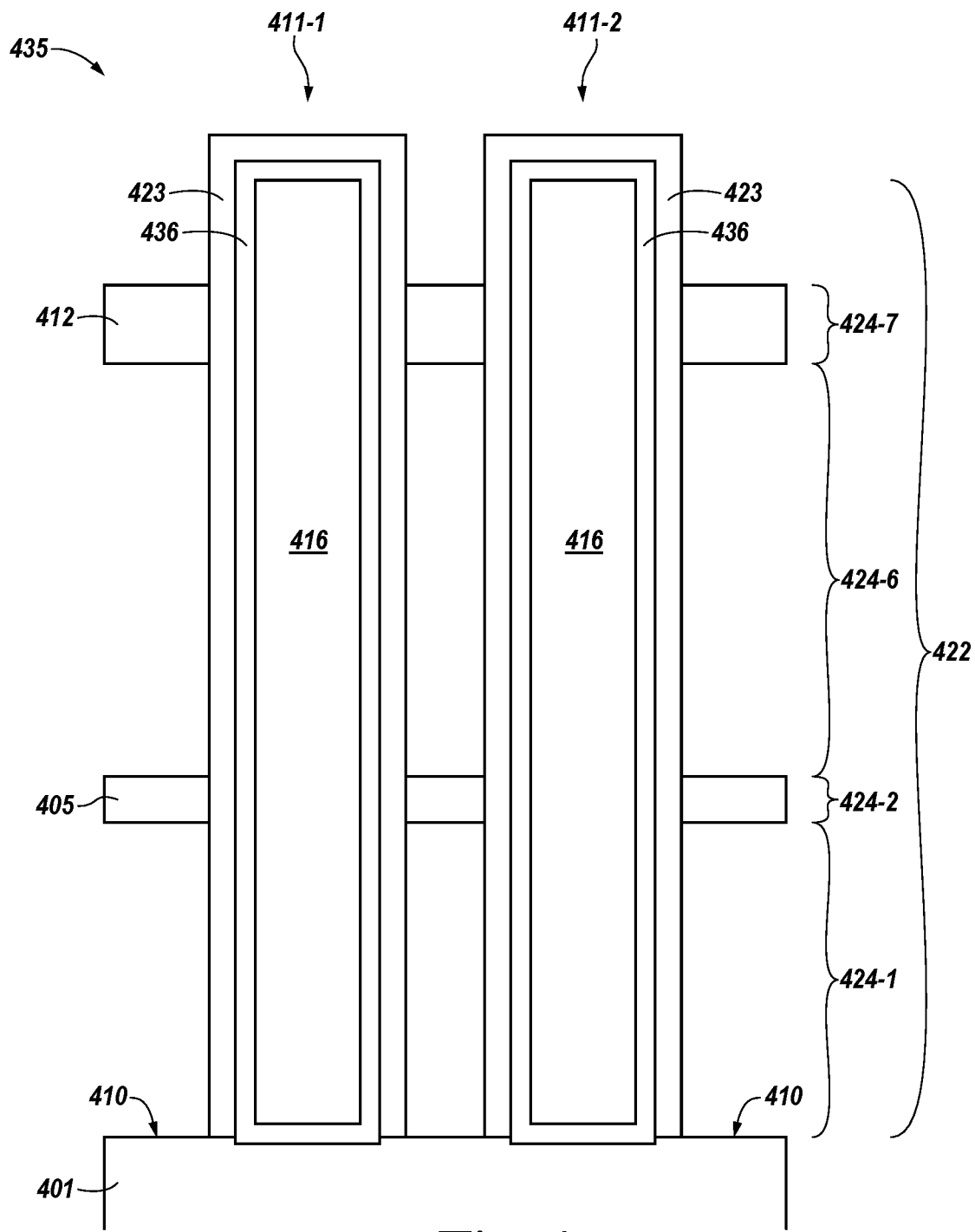

FIG. 4 illustrates a cross-sectional view 435 of a portion of an example memory device at a particular stage in the example fabrication sequence for formation of a capacitor in accordance with a number of examples of the present disclosure. FIG. 4 illustrates a structure of the portion of the example memory device following completion of the example fabrication sequence described in connection with FIG. 3.

As shown, a dielectric material 423 has been formed (e.g., deposited) on an outer surface of the first electrode material 436. The dielectric material 423 may, in a number of examples, be formed from a surface 410 of the substrate material 401 to cover the outer surface, including an upper surface, of the first electrode material 436.

As is illustrated in FIG. 4, a height 422 of the capacitor material 416 can include a height 424-2 and 424-7 of the first nitride material 405 and the second nitride material 412 along with heights 424-6 and 424-1 of the removed first sacrificial material, second silicate material, and the second sacrificial material, and the first silicate material, respectively and the height of the previously removed third sacrificial material 114 as illustrated in FIG. 1.

Figure 5:
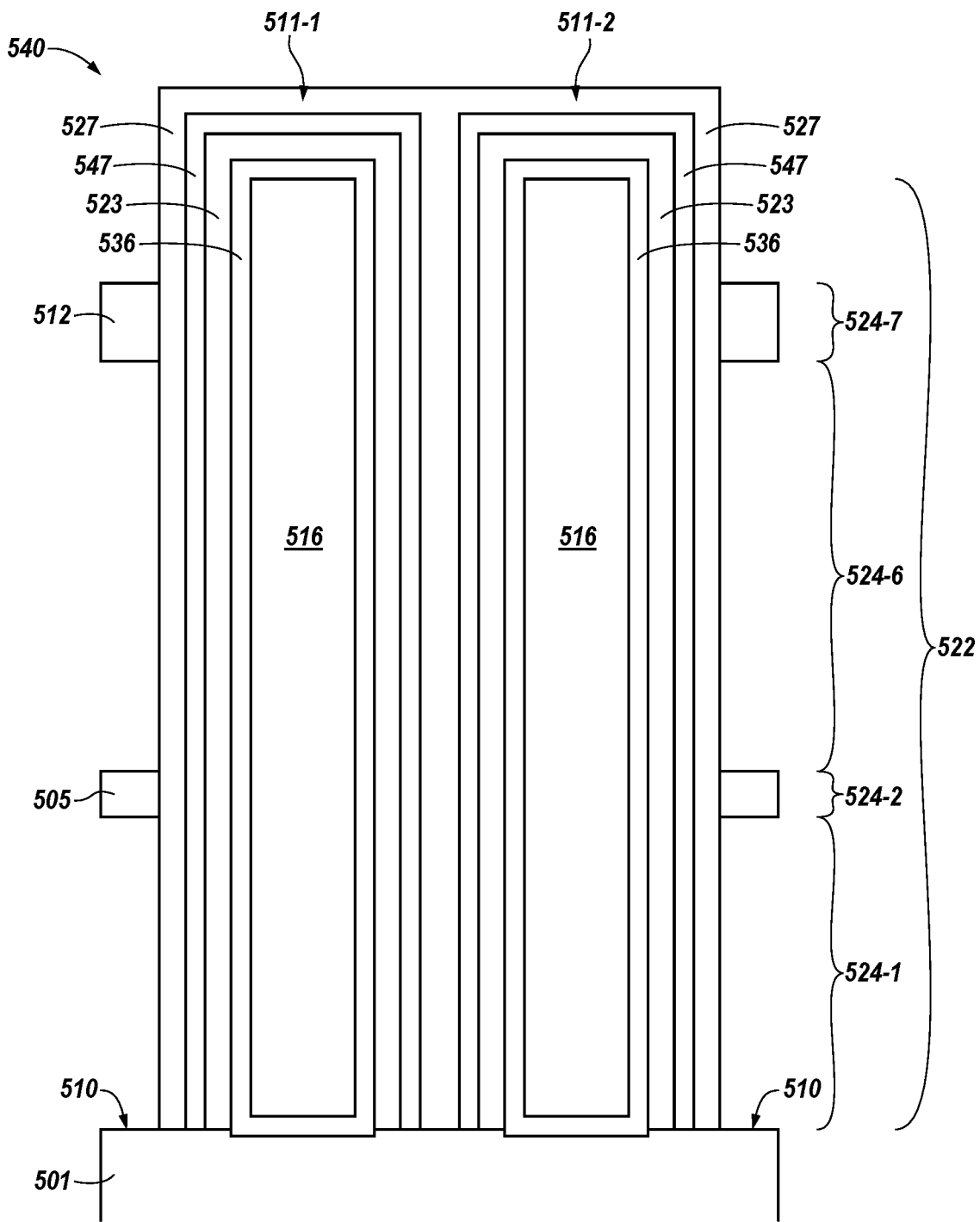

FIG. 5 illustrates a cross-sectional view 540 of a portion of an example memory device at a particular stage in the example fabrication sequence for formation of a capacitor in accordance with a number of examples of the present disclosure. FIG. 5 illustrates a structure of the portion of the example memory device following completion of the example fabrication sequence described in connection with FIG. 4.

As shown, the dielectric material 523 has been formed (e.g., deposited) on an outer surface of the first electrode material 536. The dielectric material 523 may, in a number of examples, be formed from a surface 510 of the substrate material 501 to cover the outer surface, including an upper surface, of the first electrode material 536. A capacitor 516 may be subsequently formed, at least in part, by formation (e.g., deposition) of a second electrode material 547 on an outer surface of the dielectric material 523.

As is illustrated in FIG. 5, a height 522 of the capacitor material 516 can include a height 524-2 and 524-7 of the first nitride material 505 and the second nitride material 512 along with heights 524-6, and 524-1 of the removed first sacrificial material, second silicate material, and the second sacrificial material, and the first silicate material, respectively and the height of the previously removed third sacrificial material 114 as illustrated in FIG. 1.

The portion of the example memory device illustrated in FIG. 5 shows a first and a second capacitor 516 indicated as widths in the structure and formed as just described. A height 522 of the capacitors 516 may be higher than the height of the original opening due to the dielectric material 523 and second electrode material 547 being formed over the first electrode material 536. The example memory device illustrated in FIG. 5 shows a buffer material 527 that may be formed around and between the first and second capacitors 516 as electrical insulation. The dielectric material 523, the second electrode material 547, and the buffer material 527 may be formed from various respective dielectric materials, conductive materials, and resistive materials and to various width (e.g., thickness) usable in association with formation of an operable capacitor for a semiconductor device.

The support structure is formed from the first nitride material 505 and the second nitride material 512, in addition to the underlying substrate material 501. The support structure may provide support to the first and second capacitors 516 after the removal of the first and second silicate materials has left voids in the structure of the memory device and even after such voids may have been at least partially filled by the buffer material 527. The support structure formed from the first and second nitride materials 505, 512 is shown for ease of illustration in what can be a 3D-cross sectional view to be supporting behind the capacitor 516 and the right side of the first electrode material 536 for the other capacitor 516. However, the support structure formed from the first and second nitride materials 505, 512 also may be on the opposite sides, or may be attached at four position or even surround, the first and second capacitors 516. In a number of examples, the dielectric material 523, the second electrode material 547, and/or the buffer material 527 may surround the first electrode material 536 of the capacitors 516 except at defined positions where the first and second nitride materials 505, 512 of the support structure are attached to the first electrode material 536.

Formation of the capacitors and a capacitor support structure as just described may enable each of the capacitors to be maintained in a static configuration (e.g., relative to each other and the underlying material). For example, the capacitor support structure may reduce (e.g., prevent) a possibility of a capacitor bending and/or twisting during fabrication or use. By including a sacrificial material, as described herein, a particular height of the capacitor can be supported without sacrificing exposure of surface area of the capacitors while reducing wobbling, bending and/or twisting created by an etch process with such high aspect ratios. Further, the reduction in bending and/or twisting of the capacitors may reduce a possibility of unintended consequences, such as operational failure of the semiconductor device, need to replace parts, etc.

Formation of the capacitors and capacitor support structure as just described may be utilized in fabrication of a memory device that includes at least one memory cell. Such a memory cell may include at least one such capacitor, as a data storage element, that is supported by the capacitor support structure. The memory cell also may include at least one access device (e.g., transistor) (not shown) that is, or may be, coupled to the at least one capacitor.

Figure 6:
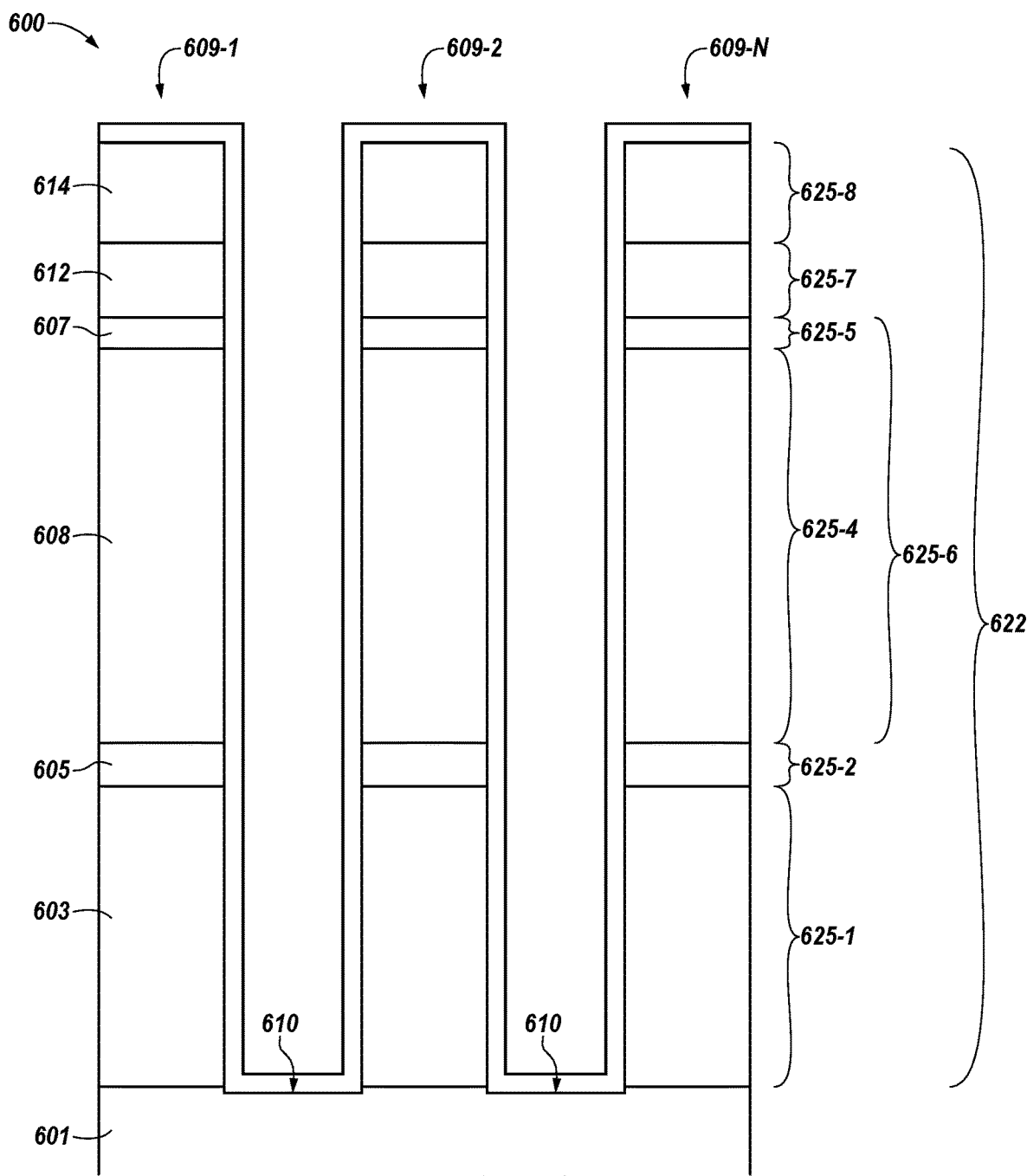

FIG. 6 illustrates a cross-sectional view 600 of a portion of an example memory device in another example of the semiconductor fabrication sequence for forming a capacitor in accordance with a number of examples of the present disclosure. FIG. 6 illustrates a structure of the portion of the example memory device with a different example on selectively patterning sacrificial material to avoid wobbling or bending of the capacitor formation as it increases in height.

The cross-sectional view 600 can include the same or similar elements as the example cross-sectional views 100, 200, 300, 435, and 540 as referenced in FIGS. 1, 2, 3, 4, and 5 respectively. For example, the substrate material 601 is analogous or similar to substrate material 101, 201, 301, 401, and 501 of FIGS. 1, 2, 3, 4, and 5 respectively. The first silicate material 603 is analogous or similar to first silicate material 103 and 203 of FIGS. 1 and 2 respectively. The first nitride material 205 is analogous or similar to first nitride material 105, 205, 305, 405, and 505 of FIGS. 1, 2, 3, 4, and 5 respectively. The second silicate material 608 is analogous or similar to second silicate material 108 and 208 of FIGS. 1 and 2 respectively. The first sacrificial material 607 is analogous or similar to second sacrificial material 107 of FIG. 1. The second nitride material 412 is analogous or similar to second nitride material 112, 212, 312, 412, and 512 of FIGS. 1, 2, 3, 4, and 5 respectively. The second sacrificial material 614 is analogous or similar to third silicate material 114 of FIG. 1.

In order to form an opening of a column of capacitor support material (as is illustrated already between plurality of pillars 609-1 and 609-2), an etch process (e.g., a first wet etch process or dry etch process) may be utilized to etch via (e.g., through) the second sacrificial material 614, the second nitride material 612, the first sacrificial material 607, the second silicate material 608, the first nitride material 605, and/or the first silicate material 603. In this example, first sacrificial material 607 is formed over the second silicate material 608, there is no sacrificial material formed over the first nitride material 605. Performance of the etch process may result in formation in an opening, through various combinations of the plurality of pillars 609, that extends from the upper surface of the second sacrificial material 614 to the surface 610 of the substrate material 601.

The resultant opening may have a height 622 in a range of from around 8,000 Angstroms (or 800 nm) to around 15,000 Angstroms (or 1,500 nm). Each of the materials can contribute a particular height to the overall height 622 of the structure. As an example, the first silicate material 603 may be a height 625-1, the first nitride material 605 may be a height 625-2, the sacrificial material 606 may be a height 625-3, the second silicate material 608 may be a height 625-4, the first sacrificial material 607 may be a height 625-5, the second nitride material 612 may be a height 625-7, and the second sacrificial material 614 can have a height 124-8, that, when added together, results in the overall height 622.

In some examples, the height 625-5 of the sacrificial material 607 and the height 625-4 of the second silicate material 608 may add up to height 625-6. That is, the height 625-6 between the first nitride material 605 and the second nitride material 612 may remain a particular height regardless of the height 625-4 of the second silicate material 608 or the height 625-5 of the first sacrificial material 607.

In some examples, the height 625-1 of the first silicate material 603 can be one of approximately 4000 Angstroms, approximately 4200 Angstroms, approximately 4500 Angstroms, approximately 4900 Angstroms, approximately 5300 Angstroms, approximately 5700 Angstroms, and/or within a range from approximately 4000 to approximately 6000 Angstroms. In some examples, the height 625-2 of the first nitride material 605 can be one of approximately 100 Angstroms, approximately 400 Angstroms, approximately 700 Angstroms, and/or within a range from approximately 100 to approximately 1000 Angstroms. In some examples, the height 625-4 of the second silicate material 608 can be one of approximately 2000 Angstroms, approximately 3500 Angstroms, approximately 4700 Angstroms, and/or within a range from approximately 2000 to 6000 Angstroms. In some examples, the height 625-5 of the sacrificial material 607 can be one of approximately 100 Angstroms, approximately 220 Angstroms, approximately 450 Angstroms, approximately 570 Angstroms, and/or within a range from approximately 100 to approximately 600 Angstroms. In some examples, the height 625-7 of the second nitride material 612 can be one of approximately 100 Angstroms, approximately 400 Angstroms, approximately 700 Angstroms, approximately 800 Angstroms, and/or within a range from approximately 100 to approximately 1500 Angstroms. In some examples, the height 625-8 of the second sacrificial material 614 can be one of approximately 500 Angstroms, approximately 750 Angstroms, approximately 970 Angstroms, approximately 1200 Angstroms, and/or within a range from approximately 500 to approximately 1500 Angstroms. However, embodiments of the present disclosure are not limited to this example.

Figure 7:
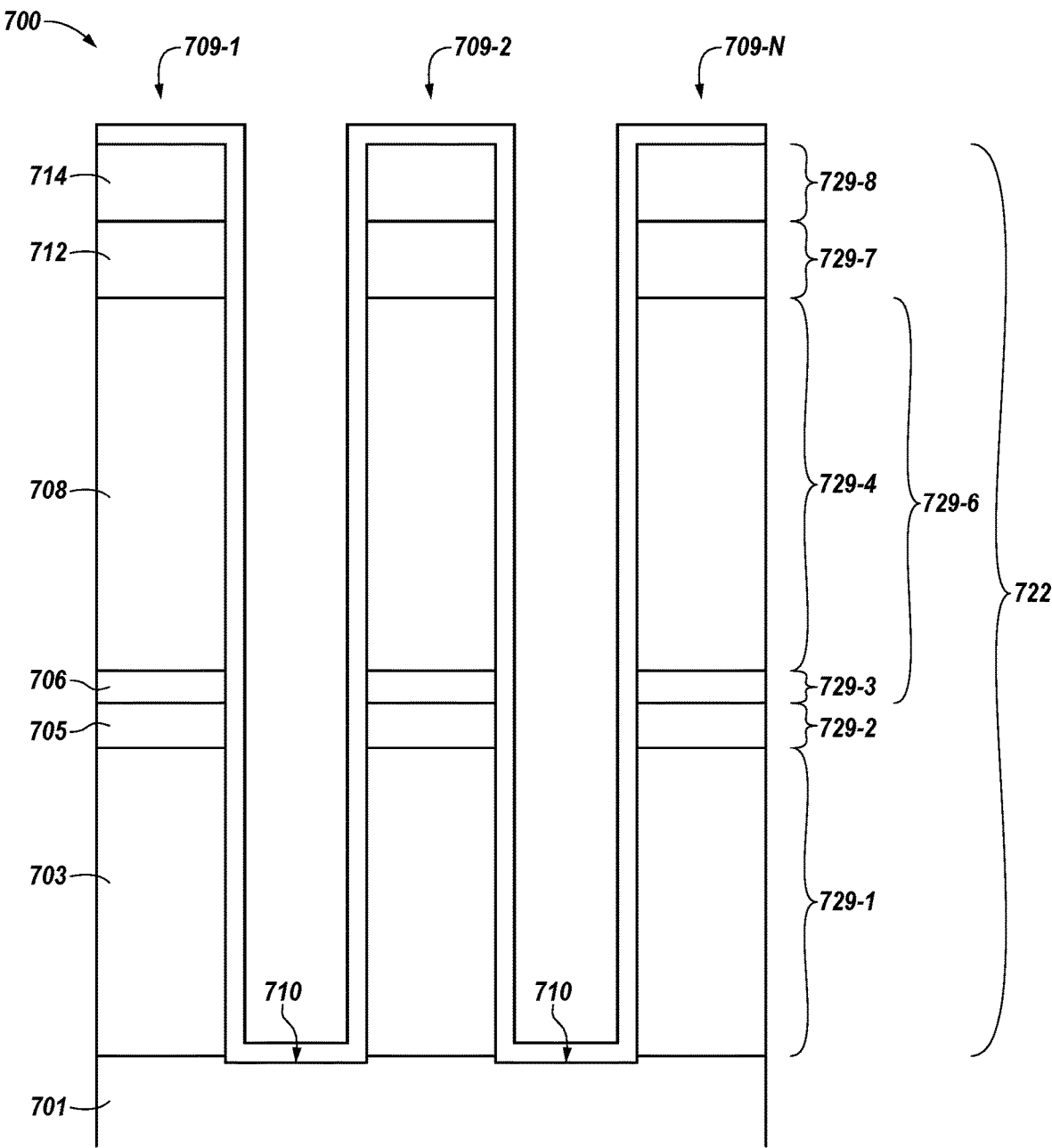

FIG. 7 illustrates a cross-sectional view 700 of a portion of an example memory device in another example of the fabrication sequence for formation of a capacitor in accordance with a number of examples of the present disclosure. FIG. 7 illustrates a structure of the portion of the example memory device with a different example on selectively patterning sacrificial material to avoid wobbling or bending of the capacitor material as it grows in height.

The cross-sectional view 700 can include the same or similar elements as the example cross-sectional views 100, 200, 300, 435, 540, and 600 as referenced in FIGS. 1, 2, 3, 4, 5, and 6 respectively. For example, the substrate material 701 is analogous or similar to substrate material 101, 201, 301, and 401, 501 and 601 of FIGS. 1, 2, 3, 4, 5, and 6 respectively. The first silicate material 703 is analogous or similar to substrate material 103, 203, and 603 of FIGS. 1, 2, and 6 respectively. The first nitride material 705 is analogous or similar to first nitride material 105, 205, 305, 405, 505, and 605 of FIGS. 1, 2, 3, 4, 5, and 6 respectively. The first sacrificial material 706 is analogous or similar to first sacrificial material 106 and 206 of FIGS. 1 and 2 respectively. The second silicate material 708 is analogous or similar to second silicate material 108, 208, and 608 of FIGS. 1, 2, and 6 respectively. The second nitride material 712 is analogous or similar to second nitride material 112, 212, 312, 412, 512, and 612 of FIGS. 1, 2, 3, 4, 5, and 6. The second sacrificial material 714 is analogous or similar to third sacrificial material 114 of FIG. 1 and second sacrificial material 614 of FIG. 6.

An etch process (e.g., a first wet etch process or dry etch process) may be utilized to etch via (e.g., through) the second sacrificial material 714, the second nitride material 712, the second silicate material 708, the first sacrificial material 706, the first nitride material 705, and the first silicate material 703 to form an opening within the previously listed materials (as is illustrated already between the plurality of pillars 709-1 and 709-2). In this example, first sacrificial material 706 is formed over the first nitride material 705, there is no sacrificial material formed over the second silicate material 708. Performance of the etch process may result in formation of a column of capacitor material in an opening through various combinations of the capacitor columns 709-1 in order to form a resultant opening that extends from the upper surface of the second sacrificial material 714 to the surface 710 of the substrate material 701.

The resultant opening may have a height 722 in a range of from around 8,000 Angstroms (or 800 nm) to around 15,000 Angstroms (or 1,500 nm). Each of the materials may contribute a particular height to the overall height 722 of the structure. As is illustrated in FIG. 7, the first silicate material 703 can have a height 729-1, the first nitride material 705 can have a height 729-2, the first sacrificial material 706 can have a height 729-3, the second silicate material 708 can have a height 729-4, the second nitride material 712 can have a height 729-7, and the second sacrificial material 714 can have a height 729-8, that, when added together, results in the overall height 722.

In some examples, the height 729-3 of the first sacrificial material 706 and the height 729-4 of the second silicate material 708 may add up to a height 729-6. The height 729-6 between the first nitride material 705 and the second nitride material 712 may remain the same whether there are only one or two sacrificial materials. In this example, the height 729-6 may remain the same once the first sacrificial material 706 and the second silicate material 708 have been etched away.

In some examples, the height 729-1 of the first silicate material 703 can be one of approximately 4000 Angstroms, approximately 4200 Angstroms, approximately 4500 Angstroms, approximately 4900 Angstroms, approximately 5300 Angstroms, approximately 5700 Angstroms, and/or within a range from approximately 4000 to approximately 6000 Angstroms. In some examples, the height 729-2 of the first nitride material 705 can be one of approximately 100 Angstroms, approximately 400 Angstroms, approximately 700 Angstroms, and/or within a range from approximately 100 to approximately 1000 Angstroms. In some examples, the height 729-3 of the first sacrificial material 706 can be one of approximately 100 Angstroms, approximately 300 Angstroms, approximately 550 Angstroms, approximately 870 Angstroms, and/or within a range from approximately 100 to approximately 1000 Angstroms. In some examples, the height 729-4 of the second silicate material 708 can be one of approximately 2000 Angstroms, approximately 3500 Angstroms, approximately 4700 Angstroms, and/or within a range from approximately 2000 to 6000 Angstroms. In some examples, the height 729-7 of the second nitride material 712 can be one of approximately 100 Angstroms, approximately 400 Angstroms, approximately 700 Angstroms, approximately 800 Angstroms, and/or within a range from approximately 100 to approximately 1500 Angstroms. In some examples, the height 729-8 of the second sacrificial material 714 can be one of approximately 500 Angstroms, approximately 750 Angstroms, approximately 970 Angstroms, approximately 1200 Angstroms, and/or within a range from approximately 500 to approximately 1500 Angstroms. However, embodiments of the present disclosure are not limited to this example.

Figure 8:
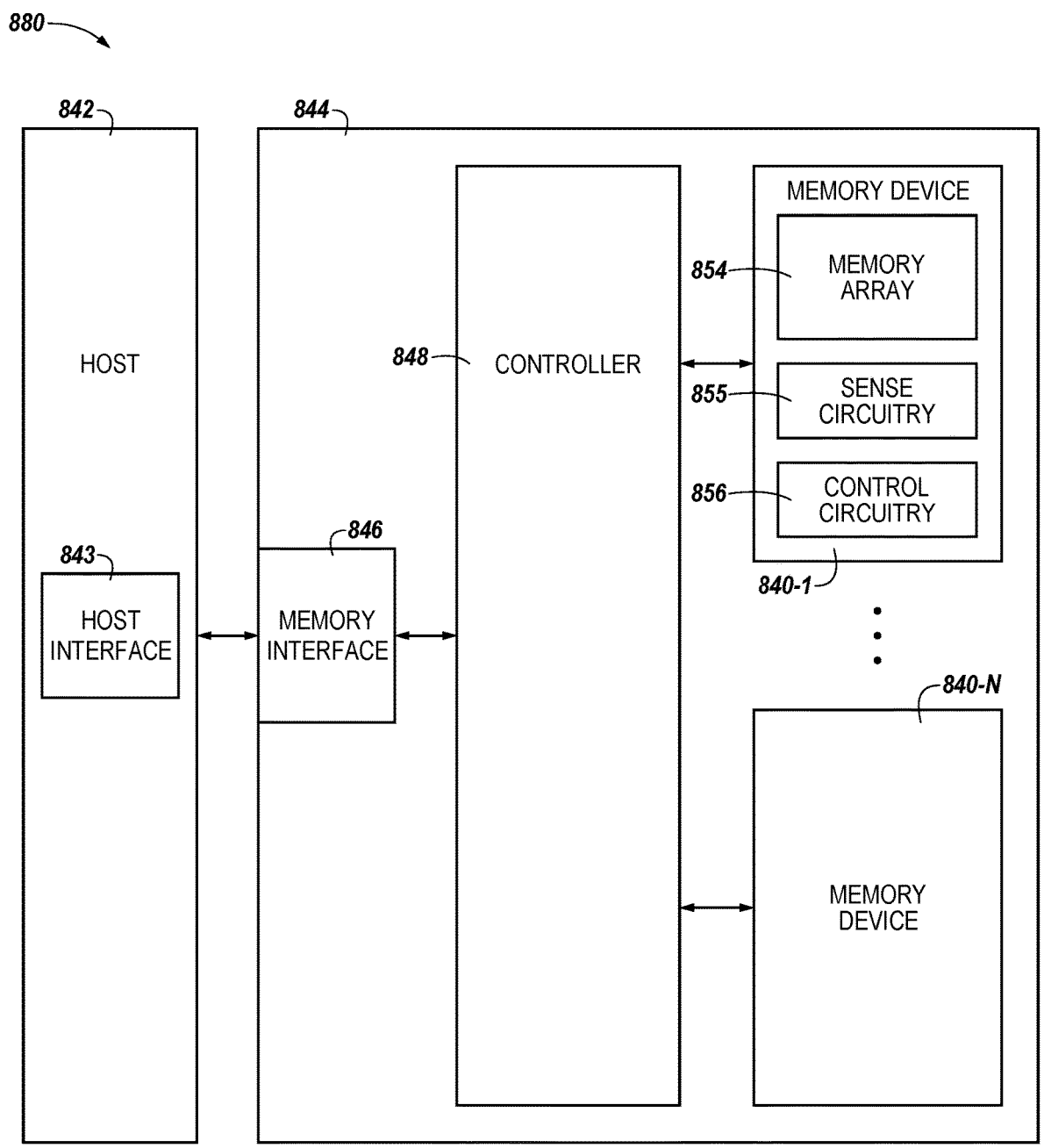
FIG. 8 illustrates a functional block diagram of a computing system including at least one memory system in accordance with one or more examples of the present disclosure.

FIG. 8 is a functional block diagram of a computing system 880 including at least one memory system 844 in accordance with one or more examples of the present disclosure. Memory system 844 may be, for example, a solid-state drive (SSD).

In the example illustrated in FIG. 8, memory system 844 includes a memory interface 846, a number of memory devices 840-1, . . . , 840-N, and a controller 848 selectably coupled to the memory interface 846 and memory devices 840-1, . . . , 840-N. Memory interface 846 may be used to communicate information between memory system 844 and another device, such as a host 842. Host 842 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, PDAs, memory card readers, interface hubs, and the like. Such a host 107a may be associated with fabrication operations performed on semiconductor devices and/or SSDs using, for example, a processing.

In a number of examples, host 842 may be associated with (e.g., include or be coupled to) a host interface 843. The host interface 843 may enable input of scaled preferences (e.g., in numerically and/or structurally defined gradients) to define, for example, critical dimensions (CDs) of a final structure or intermediary structures of a memory device (e.g., as shown at 840) and/or an array of memory cells (e.g., as shown at 854) formed thereon to be implemented by the processing apparatus. The scaled preferences may be provided to the host interface 843 via input of a number of preferences stored by the host 842, input of preferences from another storage system (not shown), and/or input of preferences by a user (e.g., a human operator).

Memory interface 846 may be in the form of a standardized physical interface. For example, when memory system 844 is used for information (e.g., data) storage in computing system 880, memory interface 846 may be a serial advanced technology attachment (SATA) interface, a peripheral component interconnect express (PCIe) interface, or a universal serial bus (USB) interface, among other physical connectors and/or interfaces. In general, however, memory interface 106a may provide an interface for passing control, address, information, scaled preferences, and/or other signals between the controller 848 of memory system 844 and a host 842 (e.g., via host interface 843).

Controller 848 may include, for example, firmware and/or control circuitry (e.g., hardware). Controller 848 may be operably coupled to and/or included on the same physical device (e.g., a die) as one or more of the memory devices 840-1, . . . , 840-N. For example, controller 848 may be, or may include, an ASIC as hardware operably coupled to circuitry (e.g., a printed circuit board) including memory interface 846 and memory devices 840-1, . . . , 840-N. Alternatively, controller 848 may be included on a separate physical device that is communicatively coupled to the physical device (e.g., the die) that includes one or more of the memory devices 840-1, . . . , 840-N.

Controller 848 may communicate with memory devices 840-1, . . . , 840-N to direct operations to sense (e.g., read), program (e.g., write), and/or erase information, among other functions and/or operations for management of memory cells. Controller 848 may have circuitry that may include a number of integrated circuits and/or discrete components. In a number of examples, the circuitry in controller 848 may include control circuitry for controlling access across memory devices 840-1, . . . , 840-N and/or circuitry for providing a translation layer between host 842 and memory system 844.

Memory devices 840-1, . . . , 840-N may include, for example, a number of memory arrays 854 (e.g., arrays of volatile and/or non-volatile memory cells). For instance, memory devices 840-1, . . . , 840-N may include arrays of memory cells, such as a portion of an example memory device 990 structured to include pillars and adjacent trenches, to form capacitors formed according to embodiments described in FIGS. 1-7, described in connection with FIG. 9. As will be appreciated, the memory cells in the memory arrays 854 of memory devices 840-1, . . . , 840-N and/or as shown at 990 may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory devices 840, 990 may be formed on the same die. A memory device (e.g., memory device 840-1) may include one or more arrays 854 of memory cells formed on the die. A memory device may include sense circuitry 855 and control circuitry 856 associated with one or more arrays 854 formed on the die, or portions thereof. The sense circuitry 855 may be utilized to determine (sense) a particular data value (e.g., 0 or 1) that is stored at a particular memory cell in a row of an array 854. The control circuitry 856 may be utilized to direct the sense circuitry 855 to sense particular data values, in addition to directing storage, erasure, etc., of data values in response to a command from host 842 and/or host interface 843. The command may be sent directly to the control circuitry 856 via the memory interface 846 or to the control circuitry 856 via the controller 848.

The example illustrated in FIG. 8 may include additional circuitry that is not illustrated so as not to obscure examples of the present disclosure. For example, memory devices 840, 990 may include address circuitry to latch address signals provided over I/O connectors through I/O circuitry. Address signals may be received and decoded by a row decoder and a column decoder to access a memory array 854. It will be appreciated that the number of address input connectors may depend on the density and/or architecture of memory devices 840, 990 and/or memory arrays 854.

Figure 9:
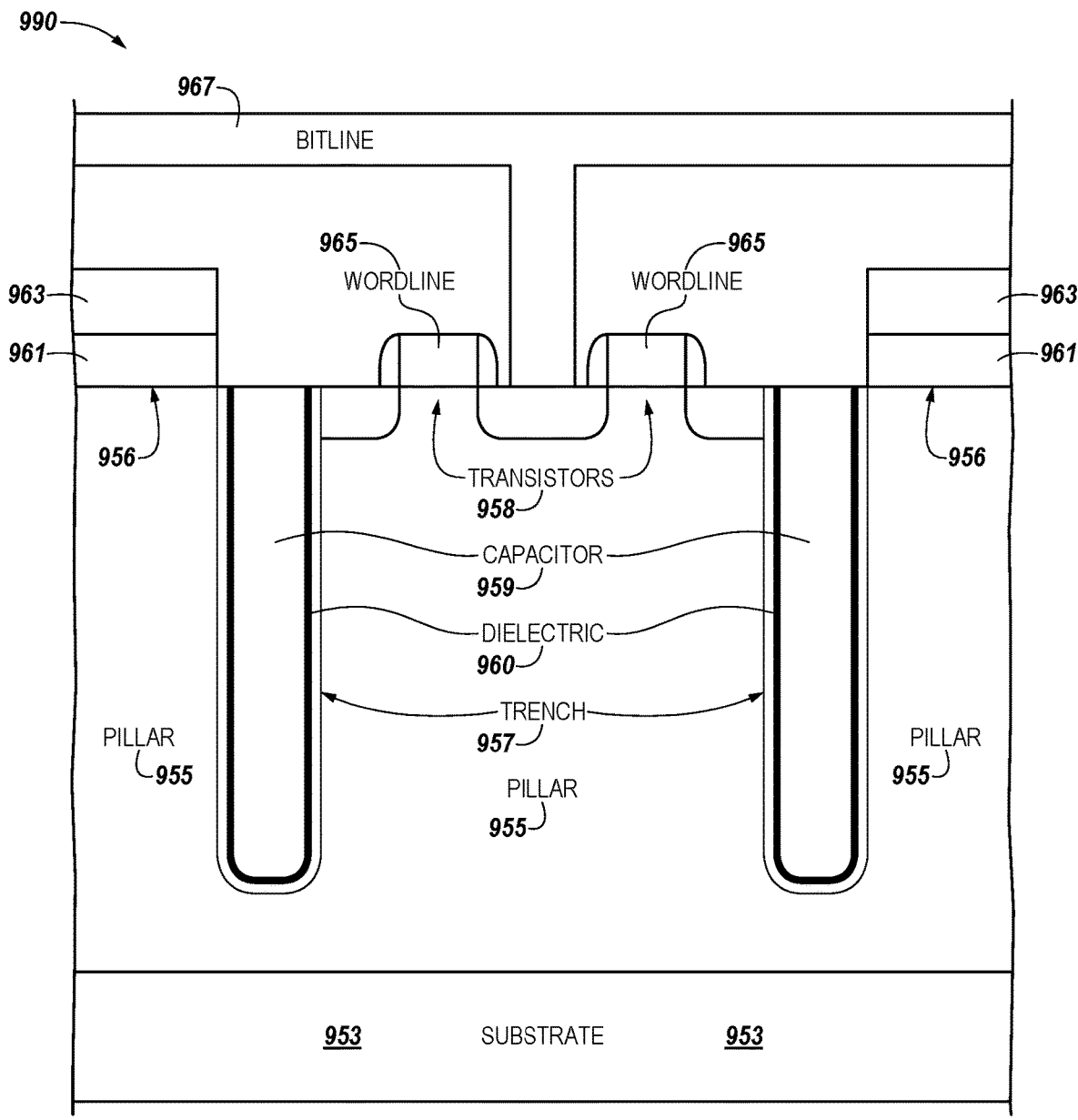
FIG. 9 illustrates a cross-sectional view of a portion of an example of semiconductor structures of a memory device that include pillars and adjacent trenches in accordance with a number of examples of the present disclosure.

FIG. 9 illustrates a cross-sectional view of a portion of an example of semiconductor structures of a memory device 990 that include pillars and adjacent trenches, to form capacitors formed according to embodiments described in FIGS. 1-7, in accordance with a number of examples of the present disclosure described in connection with FIGS. 1-7. The portion of the memory device 990 illustrated in FIG. 9 is shown by way of example and not by way of limitation to include a DRAM memory cell architecture. Another RAM, flash (e.g., NAND or NOR), and/or 3D memory cell architecture also may include pillars and adjacent trenches. Examples are not so limited. Although the DRAM transistors 958 and capacitors 959 are shown to be arranged in a lateral configuration, examples may include the transistors 958 and capacitors 959 being arranged in a lateral, a vertical, or other configurations.

The portion of the memory device 990 shown in FIG. 9 may represent two DRAM memory cells in a 1T1C (one transistor one capacitor) configuration or one DRAM memory cell in a 2T2C configuration. DRAM memory cells may utilize capacitors 959 each formed in a trench 957 to store a particular charge corresponding to a data value. Forming the trenches 957 as shown in FIG. 9 may result in a pillar 955 being formed from the etched material on each side of a trench 957. Pillars 955 may be formed (e.g., fabricated) as layers of doped or undoped semiconductor material deposited on a substrate material 953. The semiconductor material may be etched to form the pillars 955 and trenches 957. In some examples, an opening (e.g., a round, square, oblong, etc., opening rather than a rectilinear trench) may be etched into the semiconductor material and capacitor material may be deposited in the opening, although such a configuration does not affect the concept of passivation material for pillars adjacent a trench described herein.

Moreover, examples of the present disclosure are not limited to capacitors being formed in a trench for data storage, nor are examples limited to the trench containing capacitor material. For example, various types of memory devices may include trenches between sidewall structures (e.g., pillars), according to embodiments described in FIGS. 1-7, in which various materials may be positioned to contribute to data access, storage, and/or processing or in which various materials may be formed for electrical conduction and/or isolation (e.g., conductor, resistor, and/or dielectric materials), among other functions and/or operations.

In a number of examples, a trench 957 may be etched to a particular depth into a pillar material. The trench 957 may be etched into the material of the pillars 955 to a depth approaching the substrate material 953, as shown in FIG. 9. Alternatively, the trench 957 may be etched into the material of the pillars 955 to a top of or into the substrate material. The depth of the trench 957 approaching, at the top of, and/or into the substrate material, 953 is termed herein as being in the bottom region of the trench.

As described herein, deepening (e.g., etching) the trench further into the pillar material or the substrate material, formed according to embodiments described in FIGS. 1-7, may increase a surface area of the trench boundaries. In one example, increasing the surface area of the trench boundaries may increase a capacitance of a capacitor 959 formed in the trench 957 (e.g., by increasing a volume and/or surface area of the capacitor). In this example, the trench 957 may be lined with a dielectric material 960 and a capacitor material may be formed (e.g., deposited) within the trench 957 and over the dielectric material 960 to form the capacitor 959 to a particular (e.g., target) depth.

Each pillar 955 of the pillar material may extend to a particular height above the substrate material 953. As such, each pillar 955 has a top surface 956 at the particular height. A number of structural materials may be formed on or in association with the top surface 956 of the pillar 955 adjacent the trench 957. For example, a particular material 961 may be formed to contribute to data access, storage, and/or processing (e.g., conductor, resistor, and/or dielectric materials). Such a material 961 may be formed over the top surface 956 of the pillar 955 adjacent the trench 957. A mask material 963 may be formed to protect an underlying material 961 and/or the top surface 956 of the pillar 955 adjacent the trench 957 from subsequent processing and/or wear encountered in use of the memory device 990. Other structural materials that may be formed (e.g., in a DRAM configuration as shown in FIG. 6) on or in association with the top surface 956 of the pillar 955 adjacent the trench 957. The other structural materials may include the transistors 958, wordlines 965, and/or bitlines 967, among other possible structural materials. The structural materials just described as being formed on and/or in association with the top surface 956 of the pillar 955 adjacent the trench 957 are termed herein as being in a top region of the pillar 955 and/or trench 957.

In the above detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

It is to be understood that the terminology used herein is for the purpose of describing particular examples only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example examples including various combinations and configurations of semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches, among other materials and/or components related to formation of a capacitor using a sacrificial material have been illustrated and described herein, examples of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches related to use of a sacrificial material in formation of a capacitor than those disclosed herein are expressly included within the scope of this disclosure.

Although specific examples have been illustrated and described herein, those of ordinary skill in the art will appreciate that an arrangement calculated to achieve the same results may be substituted for the specific examples shown. This disclosure is intended to cover adaptations or variations of one or more examples of the present disclosure. It is to be understood that the above description has been made in an illustrative fashion, and not a restrictive one. Combination of the above examples, and other examples not specifically described herein will be apparent to those of skill in the art upon reviewing the above description. The scope of the one or more examples of the present disclosure includes other applications in which the above structures and processes are used. Therefore, the scope of one or more examples of the present disclosure should be determined with reference to the appended claims, along with the full range of equivalents to which such claims are entitled.

In the foregoing Detailed Description, some features are grouped together in an example for the purpose of streamlining the disclosure. This method of disclosure is not to be interpreted as reflecting an intention that the disclosed examples of the present disclosure have to use more features than are expressly recited in each claim. Rather, as the following claims reflect, inventive subject matter lies in less than all features of a disclosed example. Thus, the following claims are hereby incorporated into the Detailed Description, with each claim standing on its own as a separate example.

What is claimed is:

1. A method, comprising:
   patterning a surface of a semiconductor-substrate with layers of materials, the layers of materials including:
      a first silicate material over the semiconductor substrate;
      a first nitride material over the first silicate material;
      a sacrificial material over the first nitride material;
      a second silicate material over the sacrificial material; and
      a second nitride material over the second silicate material, wherein the sacrificial material is a doped nitride material formed from a material with a faster etch rate than the first nitride material and the second nitride material;
   etching the layers of materials to form a plurality of pillars and openings between the plurality of pillars;
   forming capacitor materials in the openings; and
   selectively etching the sacrificial material while leaving the first nitride material and the second nitride material intact.

2. The method of claim 1, further comprising the combination of the first silicate material, the first nitride material, the sacrificial material, the second silicate material, and the second nitride material, formed to a height of greater than 10,000 Angstroms.

3. The method of claim 2, further comprising the first silicate material, the first nitride material, the sacrificial material, and the second silicate material consisting up to 9,000 Angstroms of the height greater than 10,000 Angstroms.

4. The method of claim 1, further comprising a height of the first silicate material being between 4,000 and 6,000 Angstroms.

5. The method of claim 1, further comprising a height of the first nitride material and the sacrificial material each between 100 and 1,000 Angstroms.

6. The method of claim 1, further comprising a height of the second silicate material being between 2,000 and 6,000 Angstroms.

7. The method of claim 1, further comprising a height of each of the second nitride material being between 100 and 1,500 Angstroms.

8. The method of claim 1, further comprising forming an additional sacrificial material between the second silicate material and the second nitride material.

9. The method of claim 1, further comprising the first nitride material and the sacrificial material being between the first and the second silicate materials.

10. The method of claim 1, further comprising one of the first silicate material and the second silicate material consisting one of a borophosphosilicate glass (BPSG) material and a TEOS material.

11. A method, comprising:
patterning a surface of a semiconductor substrate with layers of materials, the layers of materials including:
a first silicate material over the semiconductor substrate;
a first nitride material over the first silicate material;
a first sacrificial material over the first nitride material;
a second silicate material over the first sacrificial material;
a second sacrificial material over the second silicate material; and
a second nitride material over the second sacrificial material, wherein the first sacrificial material and the second sacrificial material are formed from material with a faster etch rate than the first nitride material and the second nitride material and doping the first and the second sacrificial materials to form a harder nitride material than the first and second nitride material;
etching the layers of materials to form a plurality of pillars and openings between the plurality of pillars;
depositing capacitor materials in the openings; and
selectively etching the first sacrificial material and the second sacrificial material while leaving the first nitride material and the second nitride material intact.

12. The method of claim 11, further comprising the second sacrificial material between the second nitride material and the first silicate material.

13. The method of claim 12, further comprising a height of the second sacrificial material being between 100 and 600 Angstroms.

14. The method of claim 11, further comprising patterning a third sacrificial material over the second nitride material.

15. The method of claim 11, further comprising removing the first silicate material, the second silicate material, and the first and the second sacrificial material.

16. The method of claim 11, forming:
one of the first silicate material and the second silicate material from a borophosphosilicate glass (BPSG) material including a silicon compound ($SiO_2$) doped with a boron compound ($B_2O_3$) and a phosphorus compound ($P_2O_5$); and
one of the first silicate material and the second silicate material from a tetraethyl orthosilicate (TEOS) material.

17. A method, comprising:
patterning a surface of a semiconductor substrate with layers of materials, the layers of materials including:
a borophosphosilicate glass (BPSG) material over the semiconductor substrate;
a first nitride material over the BPSG material;
a first doped nitride material over the first nitride material;
a tetraethyl orthosilicate (TEOS) material over the first doped nitride material;
a second nitride material over the TEOS material;
a second doped nitride material over the second nitride material, wherein the first doped nitride material and the second doped nitride material are formed from a material with a faster etch rate than the first nitride material and the second nitride material;
etching the layers of materials to form a plurality of pillars and openings between the plurality of pillars;
forming capacitor materials in the openings; and
selectively etching the first doped nitride material and the second doped nitride material while leaving the first nitride material and the second nitride material intact.

18. The method of claim 17, wherein selectively etching the second doped nitride material exposes a portion of the capacitor materials along a width of at least 500 Angstroms.

19. The method of claim 17, further comprising:
removing the BPSG material and the TEOS material;
leaving the capacitor materials; and
leaving the first and second nitride materials as a capacitor support structure.

20. The method of claim 17, further comprising:
removing the BPSG material and the TEOS material;
leaving the capacitor materials having a first electrode material formed on an outer surface thereof; and
leaving the first and second nitride materials as a capacitor support structure.

21. A portion of a memory device formed by the method of claim 19, wherein:
the memory device comprises a memory cell that includes:
a capacitor, as a data storage element, that is supported by the capacitor support structure; and
an access device coupled to the capacitor.

22. The method of claim 17, wherein a third doped nitride material is formed over the TEOS material and the second nitride material is formed over the third doped nitride material.

23. A method, comprising:
patterning a surface of a semiconductor-substrate with layers of materials, the layers of materials including:
a first silicate material over the semiconductor substrate;
a first nitride material over the first silicate material;
a sacrificial material over the first nitride material;

a second silicate material over the sacrificial material; and a second nitride material over the second silicate material, wherein the sacrificial material is a metal doped nitride material formed from a material with a faster etch rate than the first nitride material and the second nitride material;

etching the layers of materials to form a plurality of pillars and openings between the plurality of pillars;

forming capacitor materials in the openings; and selectively etching the sacrificial material while leaving the first nitride material and the second nitride material intact.

24. A method, comprising:

patterning a surface of a semiconductor substrate with layers of materials, the layers of materials including:
- a first silicate material over the semiconductor substrate;
- a first nitride material over the first silicate material;
- a first sacrificial material over the first nitride material;
- a second silicate material over the first sacrificial material;
- a second sacrificial material over the second silicate material; and
- a second nitride material over the second sacrificial material, wherein the first sacrificial material and the second sacrificial material are formed from material with a faster etch rate than the first nitride material and the second nitride material; and the material of the first and the second sacrificial materials includes one of a TiSiN material and a TiN material;

etching the layers of materials to form a plurality of pillars and openings between the plurality of pillars;

depositing capacitor materials in the openings; and selectively etching the first sacrificial material and the second sacrificial material while leaving the first nitride material and the second nitride material intact.

* * * * *